(12) United States Patent
Yamazaki et al.

(10) Patent No.: US 6,335,231 B1
(45) Date of Patent: Jan. 1, 2002

(54) METHOD OF FABRICATING A HIGH RELIABLE SOI SUBSTRATE

(75) Inventors: Shunpei Yamazaki, Tokyo; Hisashi Ohtani, Kanagawa, both of (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 09/386,782

(22) Filed: Aug. 31, 1999

(30) Foreign Application Priority Data

Sep. 4, 1998 (JP) .......................................... 10-251635

(51) Int. Cl.⁷ .......................... H01L 21/00; H01L 21/84; H01L 21/30; H01L 21/46
(52) U.S. Cl. ....................... 438/151; 438/973; 438/977; 438/455
(58) Field of Search .................. 438/458, 150, 438/149, 151, 455; 257/755

(56) References Cited

U.S. PATENT DOCUMENTS

| | | | | |
|---|---|---|---|---|
| 4,768,076 A | * | 8/1988 | Aoki et al. ................... 357/42 |
| 4,857,986 A | * | 8/1989 | Kinugawa .................... 357/42 |
| 4,933,298 A | * | 6/1990 | Hasegawa .................... 437/62 |
| 5,643,826 A | | 7/1997 | Ohtani et al. |
| 5,793,073 A | * | 8/1998 | Kaminishi et al. .......... 257/254 |
| 5,818,076 A | * | 10/1998 | Zhang et al. ............... 257/255 |
| 5,854,123 A | * | 12/1998 | Sato et al. .................. 438/507 |
| 5,854,509 A | * | 12/1998 | Kunikiyo .................... 257/506 |
| 5,877,070 A | * | 3/1999 | Goesele et al. ............. 438/458 |
| 5,882,987 A | * | 3/1999 | Srikrishnan ................ 438/458 |
| 5,899,711 A | * | 5/1999 | Smith ........................ 438/162 |
| 5,923,962 A | | 7/1999 | Ohtani et al. |
| 5,949,107 A | * | 9/1999 | Zhang ........................ 257/347 |

* cited by examiner

Primary Examiner—John F. Niebling
Assistant Examiner—Victor Simkovic
(74) Attorney, Agent, or Firm—Cook, Alex, McFarron, Manzo, Cummings & Mehler, Ltd.

(57) ABSTRACT

A semiconductor device with high reliability is provided using an SOI substrate. When the SOI substrate is fabricated by using a technique typified by SIMOX, ELTRAN, or Smart-Cut, a single crystal semiconductor substrate having a main surface (crystal face) of a {110} plane is used. In such an SOI substrate, adhesion between a buried insulating layer as an under layer and a single crystal silicon layer is high, and it becomes possible to realize a semiconductor device with high reliability.

15 Claims, 9 Drawing Sheets

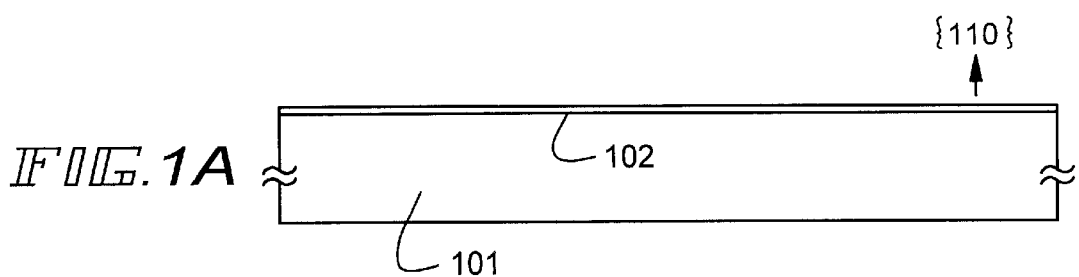
FIG. 1A
FIG. 1B
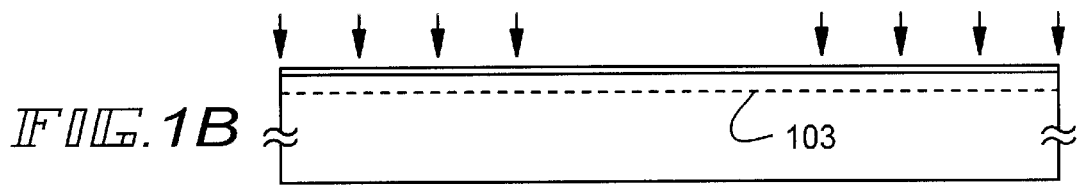
FIG. 1C
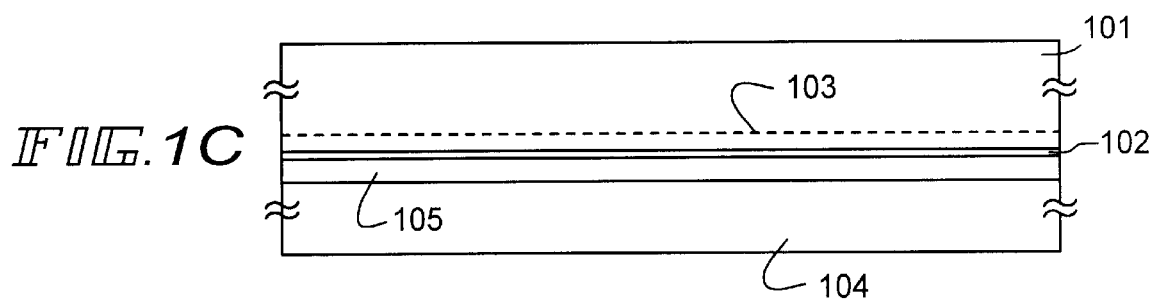
FIG. 1D
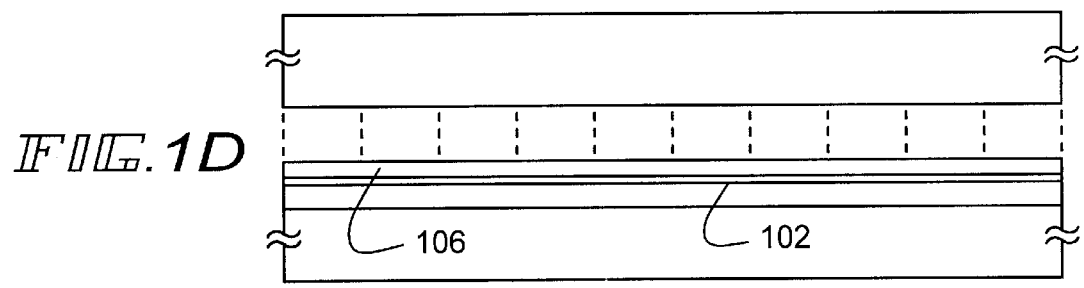
FIG. 1E
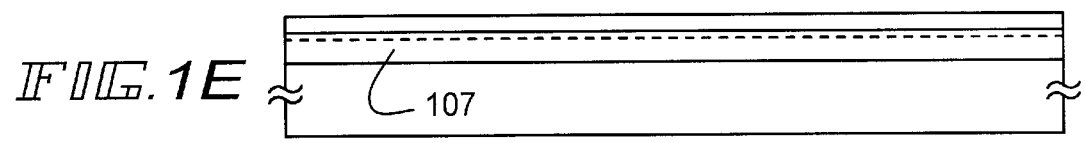
FIG. 1F

METHOD OF FABRICATING A HIGH RELIABLE SOI SUBSTRATE

BACKGROUND OF THE INVENTION

1. Field of the Invention

The present invention relates to a semiconductor device fabricated by using an SOI (Silicon on Insulator) substrate and a method of fabricating the same. Specifically, the invention relates to a semiconductor device including a thin film transistor (hereinafter referred to as TFT) formed on a SOI substrate.

Incidentally, in the present specification, the term semiconductor device indicates any device capable of functioning by using semiconductor characteristics. Thus, the semiconductor device includes not only a TFT but also an electro-optical device typified by a liquid crystal display device or a photoelectric conversion device, a semiconductor circuit in which TFTs are integrated, and electronic equipment containing such an electro-optical device or semiconductor circuit as a part.

2. Description of the Related Art

In recent years, there have been remarkable developments in VLSI techniques, and particular attention has been paid to a SOI (Silicon on Insulator) structure for achieving low power consumption. In this technique, an active region (channel formation region) of a FET, which has been conventionally formed of bulk single crystal silicon, is made a thin film single crystal silicon.

In a SOI substrate, a buried oxide film made of silicon oxide exists on single crystal silicon, and a single crystal silicon thin film is formed thereon. Various methods for fabricating such SOI substrates are known. As a typical SOI substrate, a SIMOX substrate is known. The term SIMOX is an abbreviation for Separation-by-Implanted Oxygen, and oxygen is ion implanted into a single crystal silicon substrate to form a buried oxide layer. The details of the SIMOX substrate are disclosed in K. Izumi, M. Docken and H. Ariyoshi: "C.M.O.S. devices fabrication on buried $SiO_2$ layers formed by oxygen implantation into silicon", Electron. Lett., 14, 593–594 (1978).

Recently, attention has also been paid to a bonded SOI substrate. The bonded SOI substrate achieves the SOI structure by bonding two silicon substrates as suggested by its name. If this technique is used, a single crystal silicon thin film can be formed also on a ceramic substrate or the like.

Among the bonded SOI substrates, in recent years, attention has been especially paid to a technique called ELTRAN (registered trademark by Canon K.K.). This technique is a method of fabricating a SOI substrate using selective etching of a porous silicon layer. The particular technique of the ELTRAN method is disclosed in, K. Sakaguchi et al., "Current Progress in Epitaxial Layer transfer (ELTRAN)", IEICE TRANS. ELECTRON. Vol. E80 C. No. 3 pp. 378–387 March 1997, in detail.

Another SOI technique attracting attention, there is called Smart-Cut (registered trademark of SOITEC Co.). The Smart-Cut method is a technique developed by SOITEC Co. in France in 1996, and is a method of fabricating a bonded SOI substrate using hydrogen embrittlement. The particular technique of the Smart-Cut method is disclosed in detail "Industrial Research Society (Kogyo Chosa Kai); Electronic Material, August, pp. 83–87, 1977".

When the foregoing SOI substrate is fabricated, a single crystal silicon substrate having a main surface of a crystal face of a {100} plane (crystal orientation is <100> orientation) has been used in all of these techniques. The reason is that the {100} plane has lowest interface state density (Qss) and is suitable for a field effect transistor that is sensitive to interface characteristics.

However, with respect to the SOI substrate used for a TFT, since a single crystal silicon thin film must be formed on an insulating layer, higher priority must be given to the adhesion to the insulating layer than the interface state density. That is, even if the interface state density is low, it is meaningless if the single crystal silicon thin film peels off.

SUMMARY OF THE INVENTION

The present invention was conceived in view of such problems, and an object thereof is to provide a semiconductor device with high reliability by fabricating a SOI substrate suitable for a TFT and by forming TFTs on the substrate.

The structure of the present invention disclosed in the present specification is fabricated by a method comprising the steps of:

forming a hydrogen-containing layer at a predetermined depth in a single crystal semiconductor substrate having a main surface of a {110} plane;

bonding the single crystal semiconductor substrate and a supporting substrate to each other;

splitting the single crystal semiconductor substrate by a first heat treatment along the hydrogen-containing layer;

performing a second heat treatment at a temperature of 900 to 1200° C.;

grinding a single crystal semiconductor layer remaining on the supporting substrate and having a main surface of a {110} plane; and forming a plurality of TFTs each having an active layer in the single crystal semiconductor layer.

Further, another structure of the present invention is fabricated by a method comprising the steps of:

forming a porous semiconductor layer by anodization of a single crystal semiconductor substrate having a main surface of a {110} plane;

performing a heat treatment on the porous semiconductor layer in a reducing atmosphere;

carrying out epitaxial growth of a single crystal semiconductor layer having a main surface of a {110} plane on the porous semiconductor layer;

bonding the single crystal semiconductor substrate and a supporting substrate to each other;

performing a heat treatment at a temperature of 900 to 1200° C.;

grinding the single crystal semiconductor substrate until the porous semiconductor layer is exposed;

removing the porous semiconductor layer to expose the single crystal semiconductor layer; and forming a plurality of TFTs each having an active layer of the single crystal semiconductor layer on the supporting substrate.

Still, another structure of the present invention is fabricated by a method comprising the steps of:

forming an oxygen-containing layer at a predetermined depth in a single crystal semiconductor substrate having a main surface of a {110} plane;

changing the oxygen-containing layer into a buried insulating layer by a heat treatment; and forming a plurality of TFTs each having an active layer of a single crystal semiconductor layer having a main surface of a {110} plane on the buried insulating layer.

BRIEF DESCRIPTION OF THE DRAWINGS

FIGS. 1A to 1F are views showing fabricating steps of a SOI substrate of Embodiment 1.

DETAILED DESCRIPTION OF THE PREFERRED EMBODIMENTS

The gist of the present invention is to use a single crystal semiconductor substrate having a main surface of a $\{110\}$ plane (crystal face is a $\{110\}$ plane) as a forming material of a single crystal semiconductor layer finally formed on a supporting substrate when a SOI substrate is fabricated by using a SOI technique such as. SIMOX, ELTRAN, or Smart-Cut.

Although the semiconductor describe herein typically is silicon, the term also includes other semiconductors such as silicon germanium.

The reason why a single crystal semiconductor substrate having a main surface of a $\{110\}$ plane is used as a forming material of a single crystal semiconductor layer will be described below. This description will be made using single crystal silicon as an example.

As single crystal silicon, although that formed by a FZ method or that formed by a CZ method can be used, in the present invention, it is preferable to use single crystal silicon formed by the FZ method. In the CZ method which is the main stream at present, oxygen of about $2 \times 10^{18}$ atoms/cm$^3$ is contained for the purpose of relieving stress, so that there is a fear that electron or bole mobility is lowered. Particularly, in the case where a minute TFT is formed, this happens frequently.

However, in the case where single crystal silicon is used for the SOI substrate as in the present invention, since there are many cases where the thickness of a single crystal silicon layer required for an active layer of a TFT is as thin as 10 to 50 nm, it is not as necessary to take stress into consideration. Thus, even if the FZ method (oxygen content is $1 \times 10^{17}$ atoms/cm$^3$ or less), which can form single crystal silicon more inexpensively than the inexpensive CZ method, is used, satisfactory results can be obtained.

In a typical SOI substrate, a single crystal silicon layer is formed on a silicon oxide film. Thus, adhesion and conformity between the silicon oxide layer and the single crystal silicon layer become important. From such a viewpoint, in the SOI substrate, when the single crystal silicon layer comes in contact with the silicon oxide layer, it is ideal that the contact of the single crystal silicon layer occurs with the most stable plane.

The plane which is in contact with the silicon oxide layer, with the greatest stability is a $\{110\}$ plane. This results because, in the case of the $\{110\}$ plane, the plane is in contact with the silicon oxide layer through three silicon atoms. This state will be explained with reference to photographs shown in FIGS. 9A and 9B.

Figure 9A:
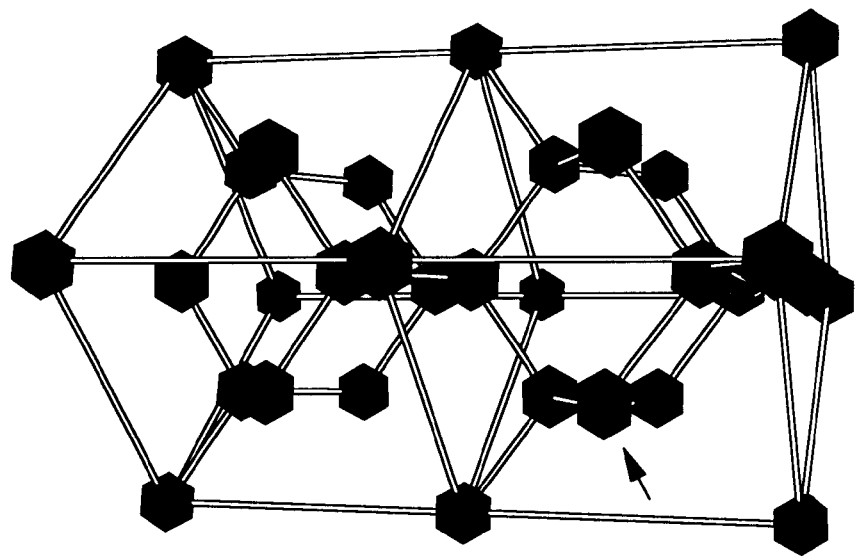
FIGS. 9A and 9B are photographs showing a crystal structure of single crystal silicon of the present invention.

FIG. 9A is a photograph of a crystal structure model showing the state where two unit lattices of single crystal silicon are placed side by side. Here, the noticeable point is the portion indicated by an arrow in the drawing. In the portion indicated by the arrow, three silicon atoms are placed side by side. All of the three silicon atoms are contained in a plane of the $\{110\}$ plane.

That is, when a single crystal silicon layer having a crystal face of the $\{110\}$ plane is formed on an insulating layer, three silicon atoms come in contact with the insulating layer.

Figure 9B:
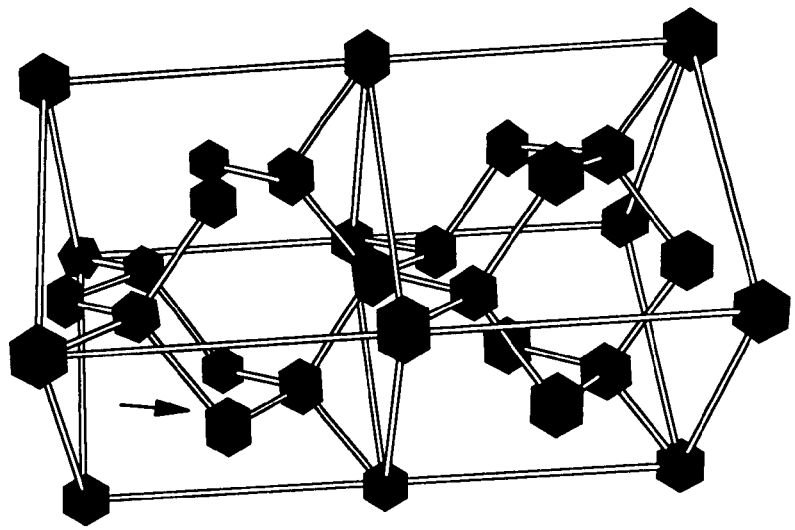

FIG. 9B is a photograph showing the state of FIG. 9A from in a different angle. In FIG. 9B, although three silicon atoms exist in a portion indicated by the arrow, these are the same as the three silicon atoms indicated by the arrow in FIG. 9A.

These three silicon atoms are also contained in the $\{110\}$ plane, and are adjacently arranged in a substantially triangular shape. That is, in such an arrangement state, the single crystal silicon layer is in contact with an insulating layer as an under layer, and forms stable contact which is realized through a "surface". This indicates that the single crystal silicon layer is in contact with the insulating layer as an under layer with very high adhesion.

On the other hand, in the case where the single crystal silicon comes in contact with the silicon oxide layer through another plane, for example, a $\{100\}$ plane or a $\{111\}$ plane, the number of silicon atoms coming in contact with the silicon n oxide layer is at most two, and an unstable contact is formed in which the contact occurs through a "line".

Further, another great merit of using the single crystal silicon layer having the main surface of the $\{110\}$ plane, that it is possible to have a silicon surface that is very flat. In the case where the main surface is the $\{110\}$ plane, a cleavage plane appears lamellarly, and it is possible to form a surface with very few asperities.

Therefore, in the present invention, first priority is given to adhesion of a single crystal silicon layer to an under layer (silicon oxide layer) in the SOI substrate, and the invention is characterized by using the single crystal silicon substrate having the crystal face of then $\{110\}$ plane which has not been conventionally used before. That is, the invention is characterized by having the single crystal semiconductor substrate having the main surface (crystal face) of the $\{110\}$ plane as a material. The SOI technique, such as SIMOX, ELTRAN, or Smart-Cut is, fully used, so that a SOI substrate with high reliability is formed. Incidentally, an oriental flat of the single crystal semiconductor substrate having the main surface of the $\{110\}$ plane may be made a $\{110\}$ plane.

Then using such an for substrate, a plurality of TFTs each having an active layer of a single crystal semiconductor thin film are formed on the same substrate, so that a semiconductor device having high reliability can be achieved.

The present invention will next be described in detail with preferred embodiments described below.

Embodiment 1

In this embodiment, with reference to FIGS. 1A to 1F and 2A to 2E, a description, is made of a SOI substrate fabricated by a Smart-Cut method, using a single crystal silicon substrate having a main surface of a {110} plane, and fabricating a semiconductor device using the SOI substrate.

First, a single crystal silicon substrate 101 is prepared as a forming material of a single crystal silicon layer. Here, although a P-type substrate having a main surface of a crystal face of a {110} plane is used, a N-type substrate may be used. Of course, a single crystal silicon germanium substrate may be used, too.

Next, a thermal oxidation treatment is carried out, so that a silicon oxide film 102 is formed on the main surface (corresponding to an element forming surface). Although if a film thickness may be suitably determined by a user, the thickness is made 10 to 500 nm (typically 20 to 50 nm). This silicon oxide film 102 functions later as a part of a buried insulating layer of a SOI substrate (FIG. 1A).

At this time, the adhesion between the single crystal silicon substrate 101 and the silicon oxide film 102 becomes very high. This occurs because the silicon oxide film 102 is formed on the {110} plane in this invention, and an interface with very high conformity results. Since this interface is an interface between an active layer and an under film in a final TFT, it is very advantageous that the adhesion (conformity) be high.

The reason why the thickness of the silicon oxide film 102 can be made as thin as 20 to 50 nm is that the crystal face of the single crystal silicon substrate 101 has the {110} plane, so that the silicon oxide film having high adhesion can be formed even though it is thin.

Incidentally, the {110} plane has a problem when an oxidation reaction proceeds, in that undulation (asperity) of the silicon surface gradually becomes large. However, in the case where a thin silicon oxide film is provided, as in this embodiment, since the amount of oxidation is small, the problem of such undulation can be virtually eliminated. This is an advantage that is common to all the embodiments disclosed in the present specification.

Thus, the single crystal silicon layer formed by using this invention has a very flat surface. For example, a the distance between the top and the top of the undulation is 10 times or less (preferably 20 times or less) as long as the distance between adjacent atoms of the three atoms contained in the {110} plane. That is, it is about 5 nm or less (preferably 10 nm or less).

Next, hydrogen is added through the silicon oxide film 102 from the side of the main surface of the single crystal silicon substrate 101. In this case, the hydrogen addition may be carried out in the form of hydrogen ions using an ion implantation method. Of course, the hydrogen addition step may be carried out by other means. In this way, a hydrogen-containing layer 103 is formed. In this embodiment, a hydrogen ion with a dosage of $1 \times 10^{16}$ to $1 \times 10^{17}$ atom/cm$^2$ is added (FIG. 1B).

Since the depth of where the hydrogen-containing layer is formed determines the thickness of the single crystal silicon layer later, precise control is required. In this embodiment, control of a hydrogen addition profile in the depth direction is made so that the single crystal silicon layer with a thickness of 50 nm remains between the main surface of the single crystal silicon substrate 101 and the hydrogen-containing layer 103.

Since the {110} plane is the plane which has the lowest atomic density, even if hydrogen ions are added, the probability of collision with silicon atoms is lowest. As a result, it is possible to suppress damage at the time of ion addition to a minimum.

Next, the single crystal silicon substrate 101 and a supporting substrate are bonded to each other. In this embodiment, a silicon substrate 104 is used as the supporting substrate, and a silicon oxide film 105 for bonding is provided on its surface. As the silicon substrate 104, it is satisfactory if an inexpensive silicon substrate formed by the FZ method is prepared. Of course, it does not matter if a polycrystal silicon substrate is used. Besides, if only flatness can be assured, a highly refractory substrate such as a quartz substrate, a ceramic substrate, or a crystallized glass substrate may be used (FIG. 1C).

At this time, since a bonding interface is formed of highly hydrophilic silicon oxide films, they are adhered to each other with hydrogen bonds by reaction of moisture contained in both the surfaces.

Next, a heat treatment (the first heat treatment) at 400 to 600° C. (typically 500° C.) is performed. By this heat treatment, in the hydrogen-containing layer 103, a volume change of a minute vacancy occurs, and a broken surface is produced along the hydrogen-containing layer 103. By this, the single crystal silicon substrate 101 is split, so that the silicon oxide film 102 and a single crystal silicon layer 106 remain on the supporting substrate (FIG. 1D).

Next, as a second heat treatment, a furnace annealing step is carried out in a temperature range of 1050 to 1150° C. In this step, at the bonded interface, stress relaxation of the Si—O—Si bonds occurs, so that the bonded interface becomes stable. Hence, this becomes the step of completely bonding the single crystal silicon layer 106 to the supporting substrate. In this embodiment, this step is carried out at 1100° C. for 2 hours.

The bonded interface is stabilized in this way, so that a buried insulating layer 107 is defined. In FIG. 1E, a dotted line in the buried insulating layer 107 indicates the bonded interface, and means that adhesion of the interface has become strong.

Next, the surface of the single crystal silicon layer 106 is flattened. For flattening, a polishing step called CMP (Chemical Mechanical Polishing) or a furnace annealing treatment at high temperature (about 900 to 1200° C.) in a reducing atmosphere may be carried out.

The final thickness of the single crystal silicon layer 106 may be made 10 to 200 nm (preferably 20 to 100 nm).

Next, the single crystal silicon layer 106 is patterned to form an island-like silicon layer 108 which becomes an active layer of a TFT. In this embodiment, although only one island-like silicon layer is shown, a plurality of layers are formed on the same substrate (FIG. 1F).

In the manner as described above, the island-like silicon layer 108 having the main surface of the {110} plane is obtained. The present invention is characterized in that the island-like silicon layer obtained in this way is used as an active layer of a TFT, and a plurality of TFTs are formed on the same substrate.

Figure 2A:
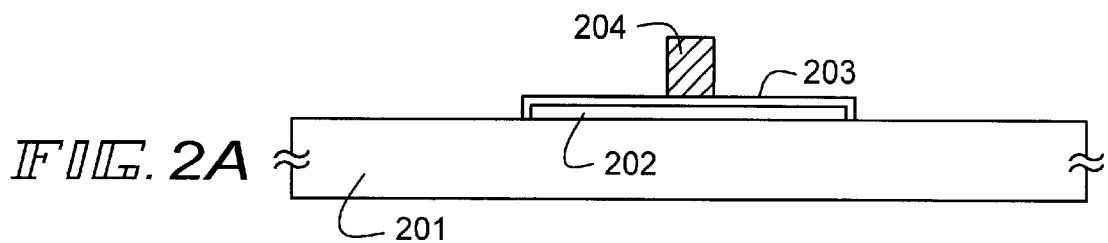
FIGS. 2A to 2E are views showing fabricating steps of a TFT of Embodiment 1.

Next, a method of forming a TFT will be described with reference to FIGS. 2A to 2E. First, the previously described steps up to the state of FIG. 1F are completed. In FIG. 2A, although a supporting substrate 201 is actually divided into the silicon substrate 104 and the buried insulating layer 107 in FIG. 1, they are shown in an integrated state for simplicity. An island-like silicon layer 202 of FIG. 2A corresponds to the island-like silicon layer 108 of FIG. 1F.

Next, a thermal oxidation step is carried out so that a silicon oxide film 203 with a thickness of 10 nm is formed on the surface of the island-like silicon layer 202. This silicon oxide film 203 functions as a gate insulating film. After the gate insulating film 203 is formed, a polysilicon film having conductivity is formed thereon, and a gate wiring line 204 is formed by patterning (FIG. 2A).

In this embodiment, although the polysilicon film having N-type conductivity is used as the gate wiring line, it is not limited to this material. For example, for the purpose of decreasing the resistance of the gate wiring line, it is also effective to use a metal material such as tantalum, a tantalum alloy, or a laminate film of tantalum and tantalum nitride. Moreover, for the purpose of obtaining the gate wiring line with further low resistance, it is also effective to use copper or a copper alloy.

After the state of FIG. 2A is obtained, an impurity to give N-type conductivity or P-type conductivity is added to form an impurity region 205. The impurity concentration at this time determines the impurity concentration of a LDD region later. In this embodiment, although arsenic with a concentration of $1 \times 10^{18}$ atoms/cm$^3$ is added, neither an impurity nor a concentration is required to be limited to this embodiment.

Next, a thin silicon oxide film 206 with a thickness of about 5 to 10 nm is formed on the surface of the gate wiring line. This may be formed by using a thermal oxidation method or a plasma oxidation method. The formation of the silicon oxide film 206 has an object to make it function as an etching stopper in a next side wall forming step.

Figure 2B:
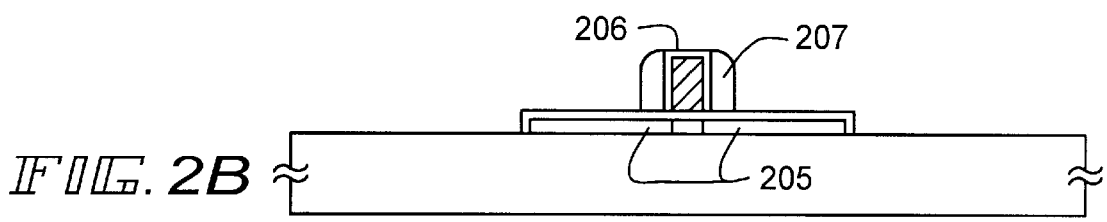

After the silicon oxide film 206 as an etching stopper is formed, a silicon nitride film is formed, and etch back is carried out, so that a side wall 207 is formed. In this way, the state of FIG. 2B is obtained.

In this embodiment, although the silicon nitride film is used as the side wall 207, a polysilicon film or an amorphous silicon film may be used. Of course, it is needless to say that if the material of the gate wiring line is changed, the possible choices of a material which can be used as the side wall is increased.

Figure 2C:
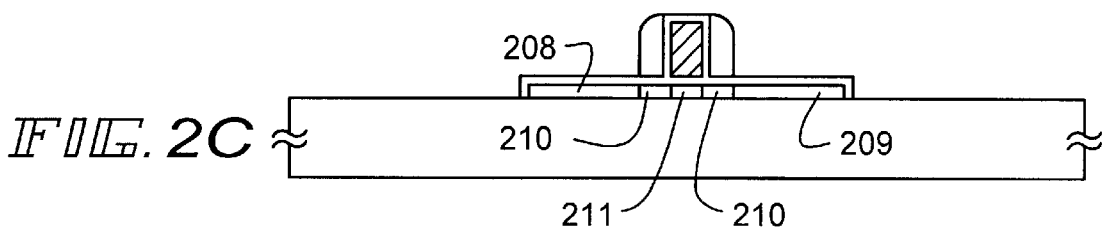

Next, an impurity having the same conductivity as the prior step is added again. The concentration of the impurity added at this time is made higher than that in the prior step. In this embodiment, arsenic is used as the impurity, and the concentration is made $1 \times 10^{21}$ atoms/cm$^3$. However, it is not necessary to be limited to this. By the impurity addition step, a source region 208, a drain region 209, a LDD region 210, and a channel formation region 211 are defined (FIG. 2C).

In this way, after the respective impurity regions are formed, activation of the impurity is carried out by furnace annealing, laser annealing, lamp annealing, or the like.

Figure 2D:
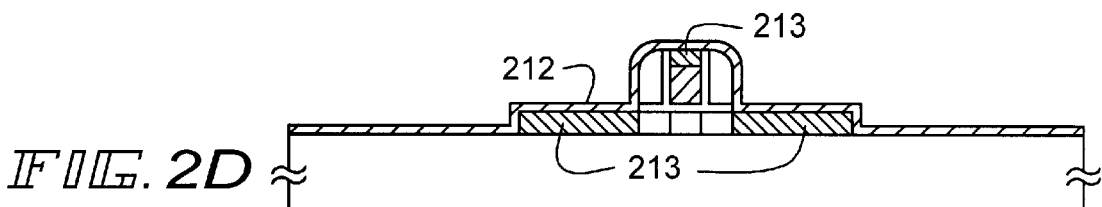

Next, silicon oxide films formed on the surfaces of the gate wiring line 204, the source region 208, and the drain region 209 are removed to expose their surfaces. Then a cobalt film 212 with a thickness of about 5 nm is formed and a thermal treatment step is carried out. As a result of this heat treatment, a reaction of cobalt and silicon occurs, so that a silicide layer (cobalt silicide layer) 213 is formed (FIG. 2D).

This technique is a well-known salicide technique. Thus, it does not matter if titanium or tungsten is used instead of cobalt, and a heat treatment condition and the like may be referred to the well-known technique. In this embodiment, the heat treatment step is carried out by using lamp annealing.

After the silicide layer 213 is formed in this way, the cobalt film 212 is removed. Thereafter, an interlayer insulating film 214 with a thickness of 1 μm is formed. As the interlayer insulating film 214, a silicon oxide film, a silicon nitride film, a silicon nitride oxide film, or a resin film, such as polyamide, polyimide, acryl, etc., may be used. Alternatively, these insulating films may be laminated.

Next, contact holes are formed in the interlayer insulating film 214, and a source wiring line 215 and a drain wiring line 216 made of a material containing aluminum as its main ingredient are formed. Finally, the entire component is subjected to furnace annealing at 300° C. for 2 hours in a hydrogen atmosphere, and hydrogenating is completed.

Figure 2E:
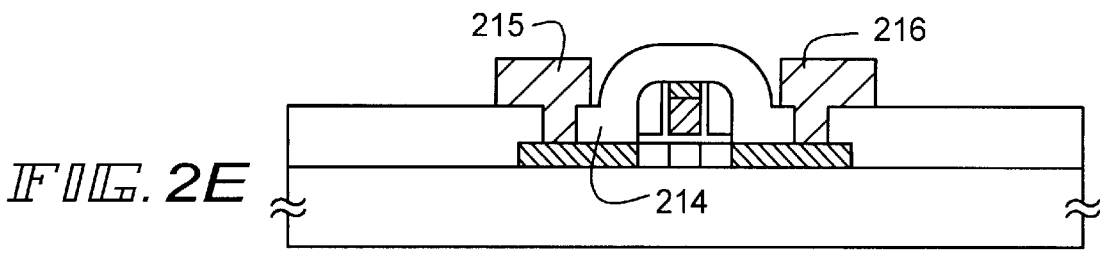

In this way, a TFT as shown in FIG. 2E is obtained. The structure described in this embodiment is merely an example, and a TFT structure to which the present invention can be applied is not limited to this example. Thus, the invention can be applied to a TFT of any well-known structure. In addition, the step condition of this embodiment is merely an example, and a user may properly determine an optimum condition other than the essential portion of the invention.

Further, in this embodiment, although the description has been made with the N-channel TFT as an example, it is also easy to fabricate a P-channel TFT. Further, it is also possible to form a CMOS circuit by forming a N-channel TFT and a P-channel TFT on the same substrate and by complementarily combining them.

Further, in the structure of FIG. 2E, if a pixel electrode (not shown) electrically connected to the drain wiring line 216 is formed by well-known means, it is also easy to form a pixel switching element of an active matrix type display device.

The invention is also a very effective technique as a method of fabricating an electro-optical device typified by a liquid crystal display device, an EL (electroluminescence) display device, an EC (electrochromic) display device, a photoelectric conversion device (optical sensor), and the like.

Embodiment 2

In this embodiment, a description will be made of an example in which a SOI substrate different from that of embodiment 1 is fabricated by using a single crystal silicon substrate having a main surface of a {110} plane, and a semiconductor device is fabricated by using the SOI substrate using FIGS. 3A to 3F. Specifically, a case where a technique called ELTRAN is used will be described.

First, a single crystal silicon substrate 301 having a main surface (crystal face) of a {110} plane is prepared. Next, the main surface is subjected to anodization to form a porous silicon layer 302. The anodization step may be carried out in a mixed solution of hydrofluoric acid and ethanol. The porous silicon layer 302 is regarded as a single crystal silicon layer provided with columnar surface holes at a surface density of about $10^{11}$ holes/cm$^3$, and succeeds to the crystal state (orientation, etc.) of the single crystal silicon substrate 301 as it is. Since the ELTRAN method itself is well known, the detailed description will be omitted here.

After the porous silicon layer 302 is formed, it is preferable to carry out a heat treatment step in a reducing atmosphere and within a temperature range of 900 to 1200° C. (preferably 1000 to 1150° C.). In this embodiment, a heat treatment at 1050° C. for 2 hours is carried out in a hydrogen atmosphere.

As the reducing atmosphere, although a hydrogen atmosphere, an ammonia atmosphere, or an inert gas atmosphere containing hydrogen or ammonia (mixed atmosphere of hydrogen and nitrogen, or hydrogen and argon, etc.) is preferable, flattening of the surface of the crystalline silicon film can be made even in an inert gas atmosphere. However, when a reduction of a natural oxidation film is carried out by using a reducing action, many silicon atoms with high energy are generated, and the flattening effect is resultantly increased. Thus, use of the reducing atmosphere is preferable.

Attention needs to be especially paid to the point that the concentration of oxygen or an oxygen compound (for example, OH radical) contained in the atmosphere must be 10 ppm or less (preferably 1 ppm or less). Otherwise, the reducing reaction by hydrogen does not occur.

At this time, in the vicinity of the surface of the porous silicon layer 302, the surface holes are filled up by movement of silicon atoms, so that a very flat silicon surface can be obtained.

Figure 3A:
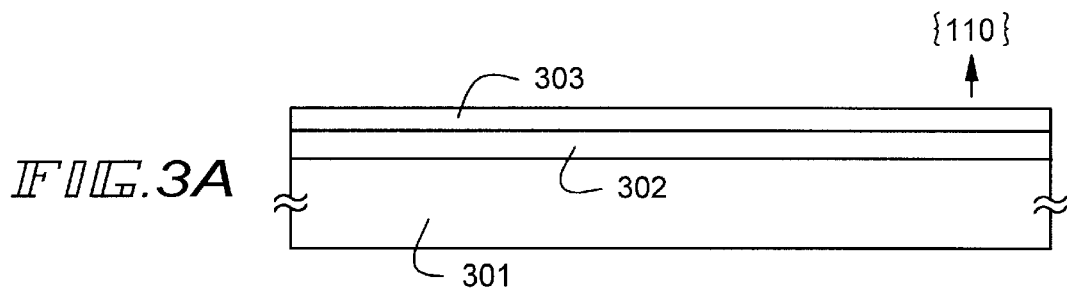
FIGS. 3A to 3F are views showing fabricating steps of a SOI substrate of Embodiment 2.

Next, a single crystal silicon layer 303 is epitaxially grown on the porous silicon layer 302. At this time, since the epitaxially grown single crystal silicon layer 303 reflects the crystal structure of the single crystal silicon substrate 301 as it is, its main surface becomes a {110} plane. The film thickness may be 10 to 200 nm (preferably 20 to 100 nm) (FIG. 3A).

Figure 3B:
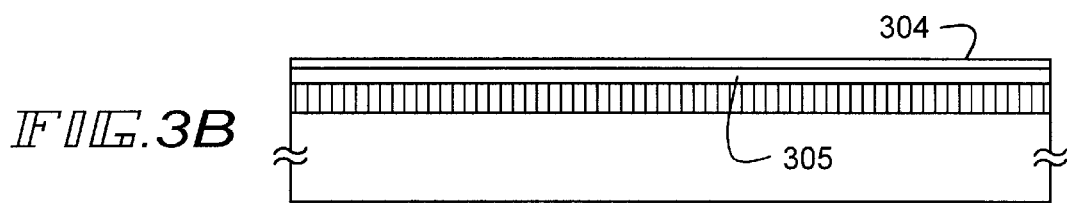

Next, the single crystal silicon layer 303 is oxidized, to forming a silicon oxide layer 304. Thermal oxidation, may be used as the forming method, as well as plasma oxidation, laser oxidation, or the like. At this time, a single crystal silicon layer 305 remains (FIG. 3B).

Next, a polycrystal silicon substrate 306, provided with a silicon oxide layer on its surface, is prepared as a supporting substrate. Of course, a ceramic substrate, a quartz substrate, or a glass ceramic substrate, each provided with an insulating film on its surface may be used.

Figure 3C:
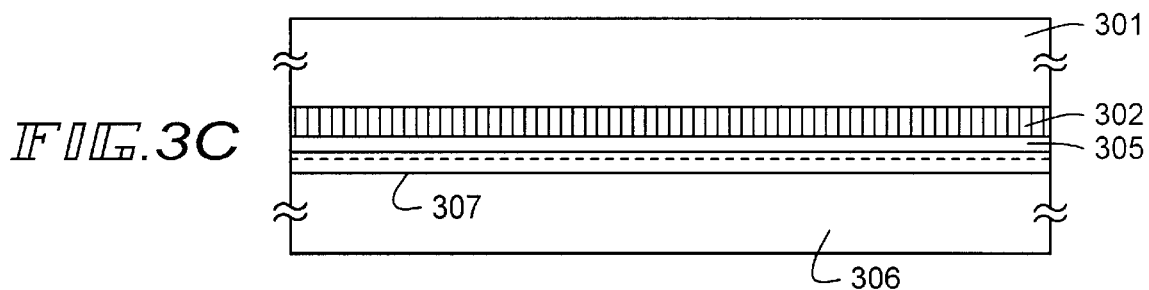

After the preparation of the single crystal silicon substrate 301 and the supporting substrate (polycrystal silicon substrate 306) is completed, the substrates are bonded to each other in such a manner that the respective main surfaces are opposite one another. In this case, the silicon oxide layer provided on each of the substrates functions as an adhesive (FIG. 3C).

After bonding is complete, a heat treatment step at a temperature of 1050 to 1150° C. is carried out, and the bonded interface made of both silicon oxide layers is stabilized. In the embodiment, this heat treatment step is carried out at 1100° C. for 2 hours. The dotted line in FIG. 3C indicates the bonded interface after adhering has been completely performed. The silicon oxide layers provided on both substrates are integrated by heat treatment to become a buried insulating layer 307.

Figure 3D:
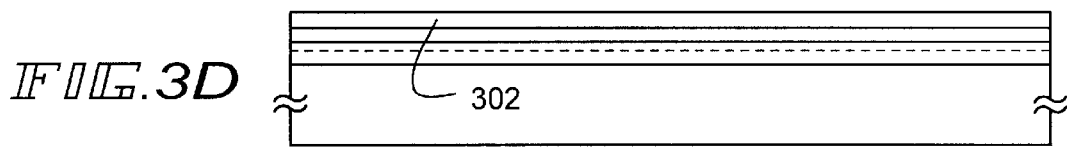

Next, the single crystal silicon substrate 301 is ground from the rear surface side by mechanical polishing, such as CMP. The grinding step is complete when the porous silicon layer 302 is exposed. In this way, the state shown in FIG. 3D is obtained.

Next, the porous silicon layer 302 is subjected to wet etching and is selectively removed. A mixed solution of a hydrofluoric acid solution and a hydrogen peroxide solution is a preferable etchant. It is reported that a solution of a mixture of 49% HF and 30% $H_2O_2$ at a ratio of 1:5 has a selecting ratio of a hundred thousand times or more between a single crystal silicon layer and a porous silicon layer.

Figure 3E:
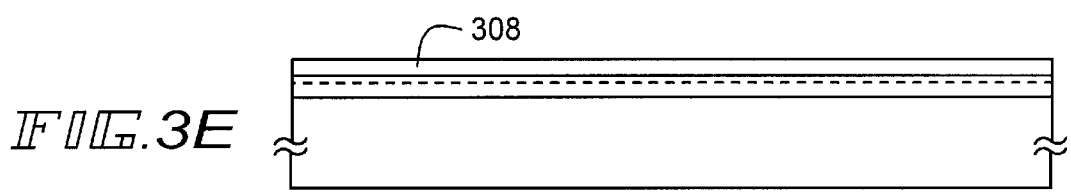
Figure 3F:
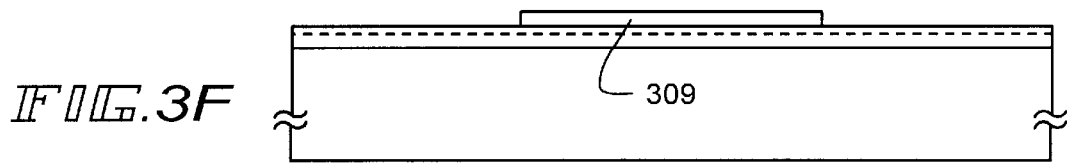

The state shown in FIG. 3E is obtained in this way. In this state, the buried insulating layer 307 is provided on the polycrystal silicon substrate 306, and a single crystal silicon layer 308 is formed thereon.

Although the SOI substrate is complete at this stage, minute asperities exist on the surface of the single crystal silicon layer 308. It therefore is desirable to carry out a heat treatment step in a hydrogen atmosphere to perform flattening. Flattening occurs due to speed-increasing surface diffusion of silicon atoms by reduction of a natural oxidation film.

At this time, because boron contained in the single crystal silicon layer 308 (that contained in a P-type silicon substrate) is released into a vapor phase by hydrogen atoms, the heat treatment step is effective to decrease impurities.

Next, the single crystal silicon layer 308 is patterned to form an island-like silicon layer 309. Although only one layer is shown in the drawings, it is needless to say that a plurality of island-like silicon layers may be formed.

Thereafter, a TFT can be fabricated in accordance with the same steps as those described in embodiment 1 with reference to FIGS. 2A to 2E. The TFT may be formed by other well-known means. In this embodiment, the detailed description will be omitted.

Embodiment 3

In this embodiment, a single crystal silicon substrate having a main surface of a {110} plane is used to fabricate an SOI substrate different from that of embodiment 1 or embodiment 2. A semiconductor device is fabricated by of the substrate using FIGS. 4A to 4C. Specifically, a case in which an SOI substrate called SIMOX is fabricated will be described.

Figure 4A:
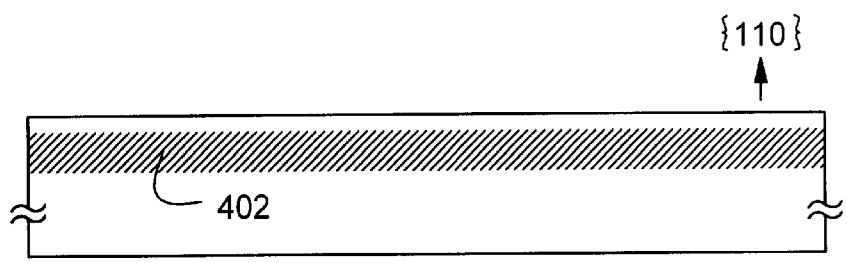
FIGS. 4A to 4C are views showing fabricating steps of a SOI substrate of Embodiment 3.

In FIG. 4A, reference numeral 401 designates a single crystal silicon substrate. In this embodiment, an oxygen ion is first added to the single crystal silicon substrate 401 to form an oxygen-containing layer 402 at a predetermined depth. The oxygen ion with a dosage of about $1\times10^{18}$ atoms/cm$^2$ may be added.

At this time, since the {110} plane has small atomic density, a probability of collision of the oxygen ion and silicon atom is low. That is, it is possible to suppress damage the the silicon surface because a minimum of oxygen is added. Of course. The damage can be further decreased if the substrate temperature is raised to 400–600° C. during the ion addition.

Figure 4B:
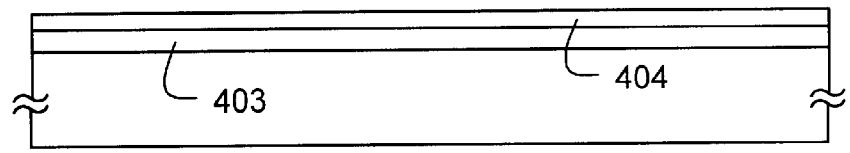
Figure 4C:
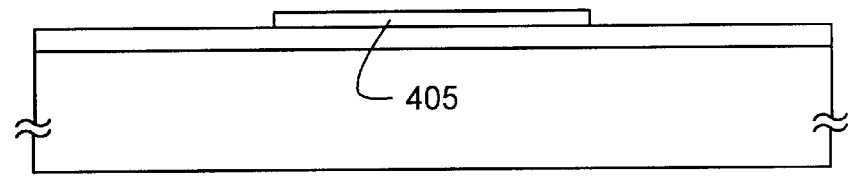

Next, heat treatment at a temperature of 800 to 1200° C. is carried out, so that the oxygen-containing layer 402 is changed into a buried insulating layer 403. The thickness of the oxygen-containing layer 402 is determined by the distribution of the oxygen ion at the ion addition, and has a distribution with a gentle tail. However, by this heat treatment, the interface between the single crystal silicon substrate 401 and the buried insulating layer 403 becomes very steep (FIG. 4B).

The thickness of this buried insulating layer 403 is 10 to 500 nm (typically 20 to 50 nm). The buried insulating layer is 20 to 50 nm thick because the interface between the single crystal silicon substrate 401 and the buried insulating layer 403 is stably coupled, a result of the fact that the single crystal silicon substrate having a main surface of the {110} plane is the material used for the single crystal silicon layer.

When the buried insulating layer 403 is formed in this way, a single crystal silicon layer 404 remains on the buried insulating layer 403. That is, in this embodiment, because the single crystal silicon substrate having the main surface of the {110} plane is used, the main surface (crystal face) of the single crystal silicon layer 404 obtained after the buried insulating layer is formed comes to have the {110} plane as well. Incidentally, adjustments may be made so that the thickness of the single crystal silicon layer 404 becomes 10 to 200 nm (preferably 20 to 100 nm).

After the single crystal silicon layer 404 is obtained in this way, patterning is carried out to obtain an island-like silicon layer 405. A plurality of island-like silicon layers may be formed.

Thereafter, a plurality of TFTs may be completed in accordance with the steps described in embodiment 1 shown in FIGS. 2A to 2E. The TFTs may be formed by other well-known means. In this embodiment, the detailed description will be omitted.

Embodiment 4

Figure 5A:
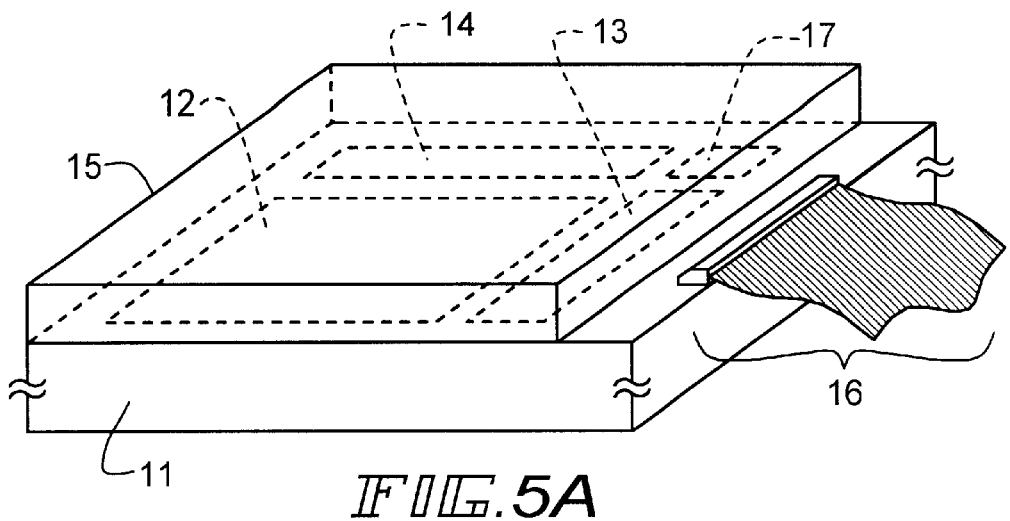
FIGS. 5A to 5C are views showing a structure of a semiconductor device (electro-optical device) of Embodiment 4.
Figure 5B:
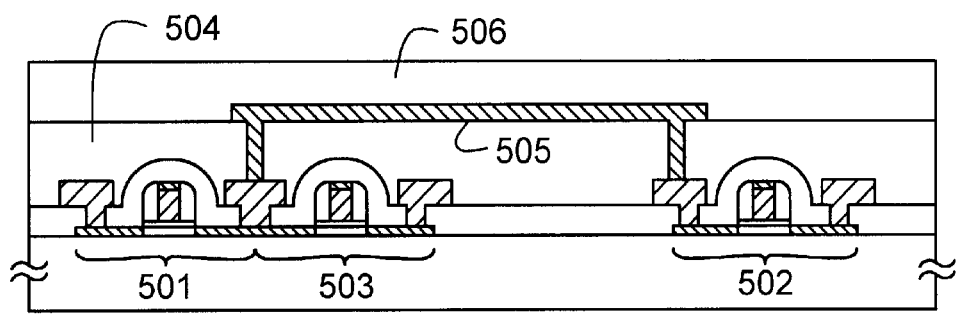
Figure 5C:
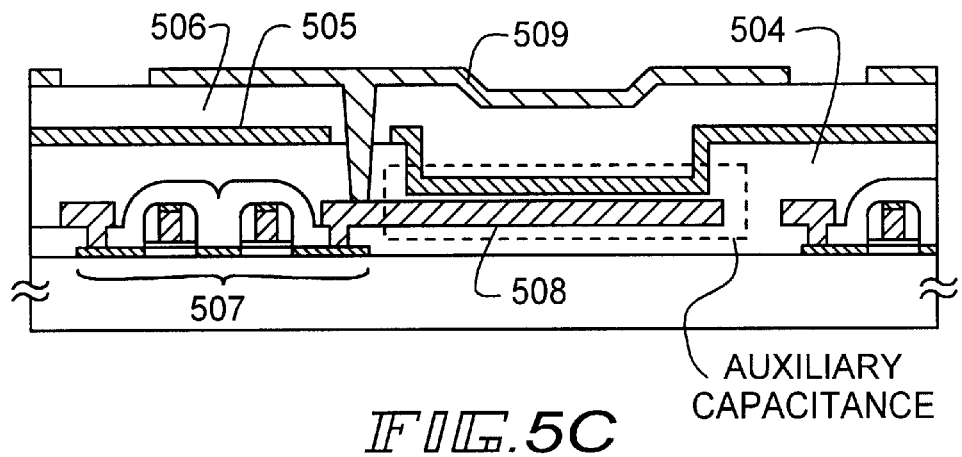

This embodiment is directed at of a reflection type liquid crystal display semiconductor device, as shown in FIGS. 5A to 5C. Since the fabrication method for a pixel TFT (pixel switching element) and a cell assembling step is well-known, the detailed description will be omitted.

In FIG. 5A, reference numeral 11 designates a substrate having an insulating surface, 12 designates a pixel matrix circuit, 13 designates a source driver circuit, 14 designates a gate driver circuit, 15 designates an opposite substrate, 16 designates an FPC (Flexible Printed Circuit), and 17 designates a signal processing circuit. A circuit performing processing for which an IC has been conventionally substituted, such as a D/A converter, a γ-correction circuit, or a signal dividing circuit, can be formed. As the signal processing circuit 17 of course, it is also possible to provide an IC chip on a glass substrate and perform signal processing on the IC chip.

Further, although the description in this embodiment has been made on the liquid crystal display device as an example, it is needless to say that the present invention can be applied to an EL (electroluminescence) display device or an EC (electrochromic) display device, as long as the display device is an active matrix type display device.

An example of driver circuits 13 and 14 of FIG. 5A is shown in FIG. 5B. Since a TFT portion has been described in embodiment 1, only necessary portions will be described here.

In FIG. 5B, reference numerals 501 and 502 designate N-channel TFTs, 503 designates a P-channel TFT, and TFTs 501 and 503 constitute a CMOS circuit. Reference numeral 504 designates an insulating layer made of a laminate film of a silicon nitride film/silicon oxide film/resin film, and a titanium wiring line 505 is provided thereon. The CMOS circuit and the TFT 502 are electrically connected to each other. The titanium wiring line is further covered with an insulating layer 506 made of a resin film. The two insulating films 504 and 506 also function as a flattening film.

A part of circuits constituting the pixel matrix circuit 12 of the FIG. 5A is shown in FIG. 5C. In FIG. 5C, reference numeral 507 designates a pixel TFT made of a double gate structure N-channel TFT, and a drain wiring line 508 is formed to widely extend into a pixel region.

Insulting layer 504 is provided thereon, and titanium wiring line 505 is provided thereon. At this time, a recess portion is formed in a part of the insulating layer 504, and only silicon nitride and silicon oxide of the lowermost layer are made to remain. By this, auxiliary capacitance is formed between the drain wiring line 508 and the titanium wiring line 505.

The titanium wiring line 505 provided in the pixel matrix circuit has an electric field shielding effect between the source/drain wiring line and a subsequent pixel electrode and also functions as a black mask at gaps between a plurality of pixel electrodes provided.

Next insulating layer 506 is provided to cover the titanium wiring line 505, and a pixel electrode 509 made of a reflective conductive film is formed thereon. Of course, contrivance to raise reflectivity may be made on the surface of the pixel electrode 509.

Although an orientation film or a liquid crystal layer is provided on the pixel electrode 509, the description will be omitted here.

The reflection type liquid crystal display device having the structure as described above can be fabricated by using the present invention. Of course, when combined with a well-known technique, it is also possible to easily fabricate a transmission type liquid crystal display device. Further, when combined with a well-known technique, it is also possible to easily fabricate an active matrix type EL display device.

Embodiment 5

The present invention can be applied to all conventional IC techniques. That is, the present invention can be applied to all semiconductor circuits presently available on the market. For example, the present invention may be applied to a microprocessor such as a RISC processor integrated on one chip or an ASIC processor, and may be applied to signal processing circuits, such as a D/A converter to and a high frequency circuits for a portable equipment, such as portable telephones, PHS's, and mobile computers.

Figure 6:
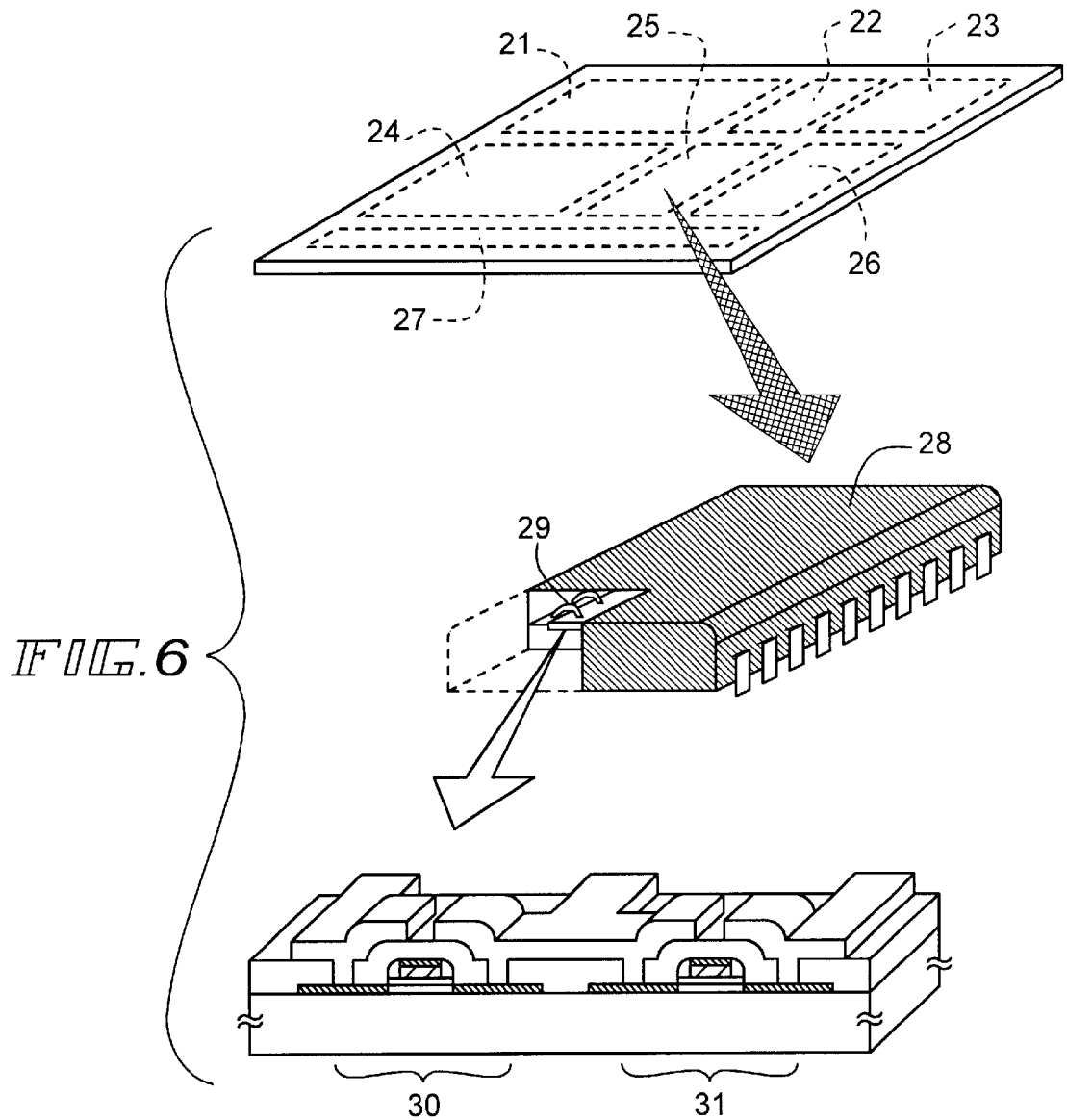
FIG. 6 is view showing a structure of a semiconductor device (semiconductor circuit) of Embodiment 5.

FIG. 6 shows an example of a microprocessor. The microprocessor is typically constituted by a CPU core 21, a RAM 22, a clock controller 23, a cache memory 24, a cache controller 25, a serial interface 26, an I/O port 27, and the like.

Of course, the microprocessor shown in FIG. 6 is a simplified example, and various circuit designs are made for actual microprocessors according to their use.

However, in any microprocessor with any function, it is an IC (Integrated Circuit) 28 that functions as a central part. The IC 28 is a functional circuit in which an integrated circuit formed on a semiconductor chip 29 is protected with ceramic or the like.

An N-channel TFT 30 and a P-channel TFT 31 having the structure of this invention constitute the integrated circuit formed on the semiconductor chip 29. Note that when a basic circuit is constituted by a CMOS circuit as a minimum unit, power consumption can be suppressed.

The microprocessor shown in this embodiment is mounted on various electronic equipment and functions as a central circuit. Typical electronic equipment includes, a personal computer, a portable information terminal equipment, and other household electric appliances. A computer for controlling a vehicle (automobile, electric train, etc.) can also be enumerated.

Embodiment 6

A CMOS circuit and a pixel matrix circuit formed by the present invention may be applied to various electro-optical devices (active matrix type liquid crystal display devices, active matrix type EL display devices, active matrix type EC display devices). Namely, the present invention may be embodied in all the electronic equipment that incorporates as display media such electro-optical devices.

Such an electronic equipment, includes a video camera, a digital camera, a projector (rear-type projector or front-type projector), a head mount display (goggle-type display), a navigation system for vehicles, a personal computer, and a portable information terminal (a mobile computer, a cellular phone, or an electronic book). Examples of those are shown in FIGS. 7A to 8D.

Figure 7A:
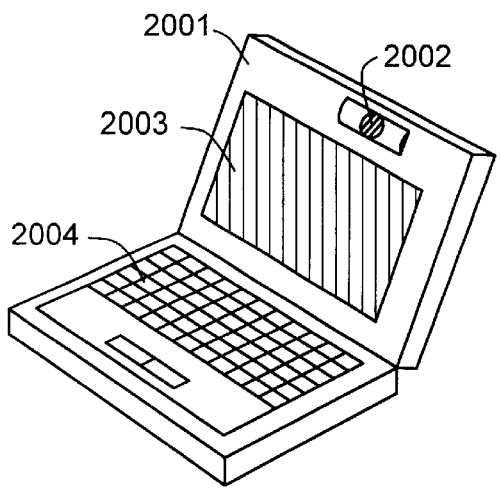
FIGS. 7A to 7F are views showing structures of semiconductor devices (electronic equipments) of Embodiment 6.

FIG. 7A shows a personal computer comprising a main body 2001, an image inputting unit 2002, a display device 2003, and a key board 2004. The present invention is applicable to the image inputting unit 2002, the display device 2003, and other signal control circuits.

Figure 7B:
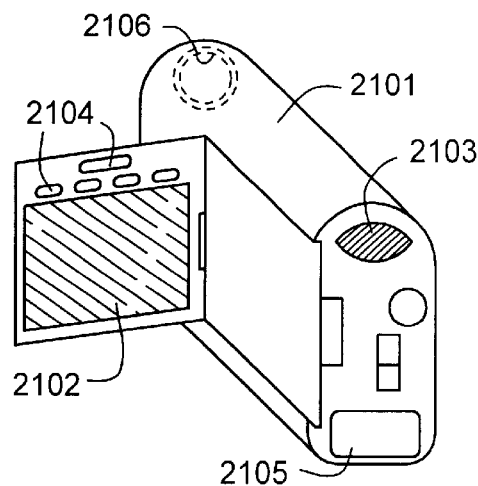

FIG. 7B shows a video camera comprising a main body 2101, a display device 2102, a voice input unit 2103, an operation switch 2104, a battery 2105, and an image receiving unit 2106. The present invention is applicable to the display device 2102, the voice input unit 2103, and other signal control circuits.

Figure 7C:
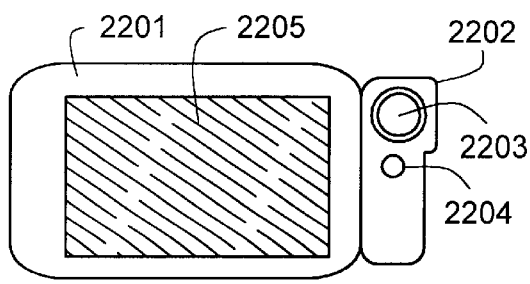

FIG. 7C shows a mobile computer comprising a main body 2201, a camera unit 2202, an image receiving unit 2203, an operation switch 2204, and a display device 2205. The present invention is applicable to the display device 2205 and other signal control circuits.

Figure 7D:
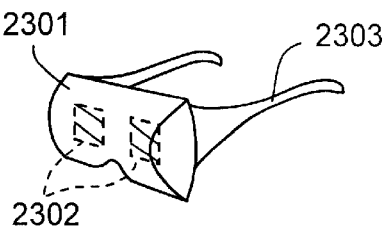

FIG. 7D shows a goggle-type display comprising a main body 2301, a display device 2302 and an arm portion 2303. The present invention is applicable to the display device 2302 and other signal control circuits.

Figure 7E:
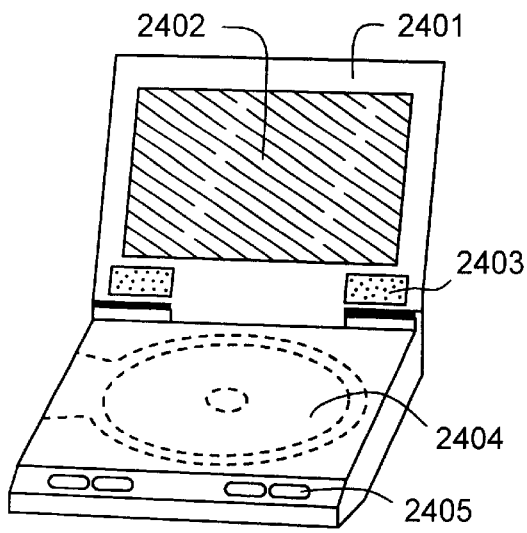

FIG. 7E shows a player that employs a recoding medium in which programs are recorded (hereinafter referred to as recording medium), and comprises a main body 2401, a display device 2402, a speaker unit 2403, a recording medium 2404, and an operation switch 2405. Incidentally, this player uses as the recoding medium a DVD (digital versatile disc), a CD and the like to serve as a tool for enjoying music or movies, for playing games and for connecting to the Internet. The present invention is applicable to the display device 2402 and other signal control circuits.

Figure 7F:
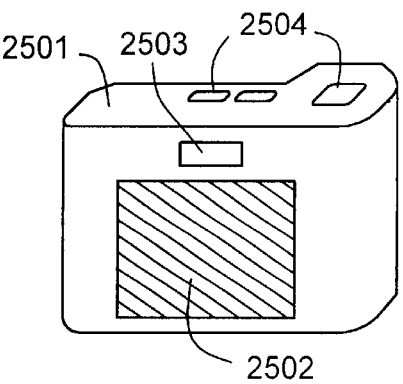

FIG. 7F shows a digital camera comprising a main body 2501, a display device 2502, an eye piece section 2503, an operation switch 2504, and an image receiving unit (not shown). The present invention is applicable to the display device 2502 and other signal control circuits.

Figure 8A:
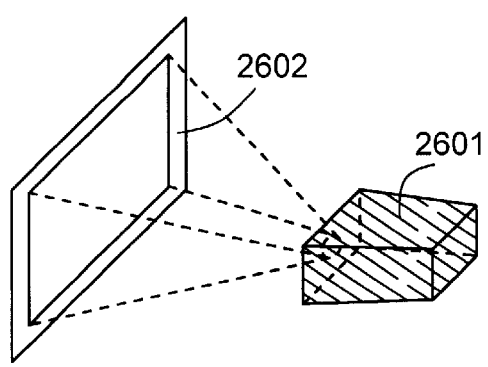
FIGS. 8A to 8D are views showing structures of semiconductor devices (electronic equipments) of Embodiment 6.

FIG. 8A shows a front-type projector comprising a display device 2601 and a screen 2602. The present invention is applicable to the display device and other signal control circuits.

Figure 8B:
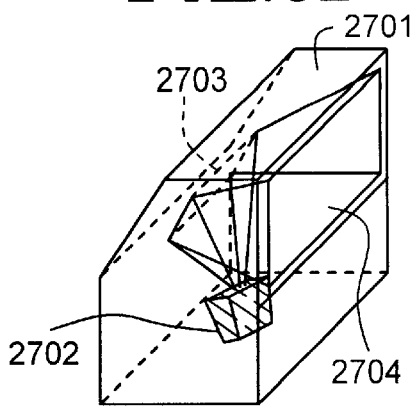

FIG. 8B shows a rear-type projector comprising a main body 2701, a display device 2702, a mirror 2703, and a screen 2704. The present invention is applicable to the display device and other signal control circuits.

Figure 8C:
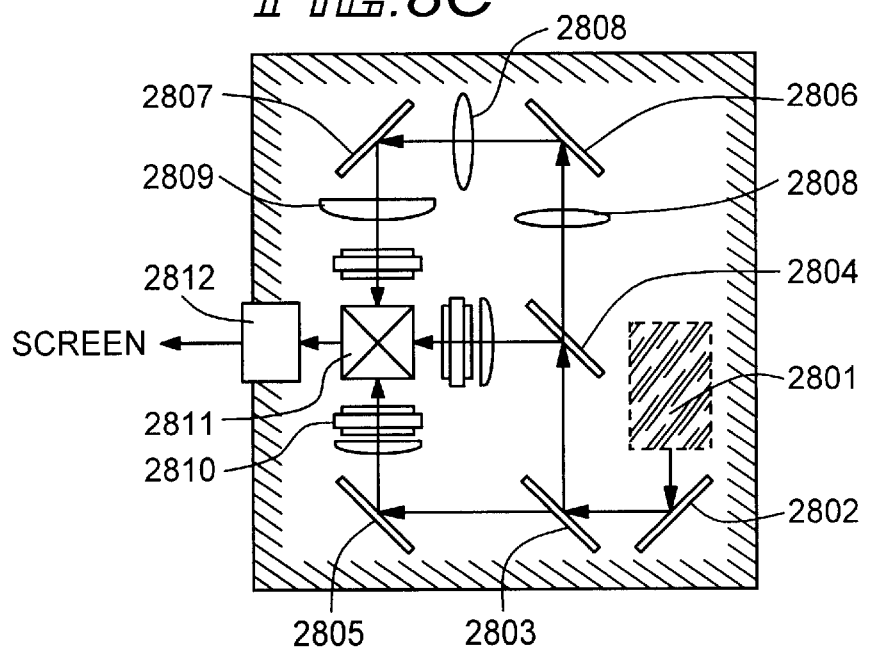

FIG. 8C is a diagram showing an example of the structure of the display devices 2601 and 2702 in FIGS. 8A and 8B. The display device 2601 or 2702 comprises a light source optical system 2801, mirrors 2802 and 2805 to 2807, dichroic mirrors 2803 and 2804, optical lenses 2808, 2809 and 2811, liquid crystal display devices 2810, and a projection optical system 2812. The projection optical system 2812 consists of an optical system including a projection lens. This embodiment shows an example of "three plate type" using three liquid crystal display devices 2810, but not particularly limited thereto. For instance, the invention may be applied also to "single plate type". Further, in the light path indicated by an arrow in FIG. 8C, an optical system such as an optical lens, a film having a polarization function, a film for adjusting a phase difference, an IR film may be provided on discretion of a person who carries out the invention.

Figure 8D:
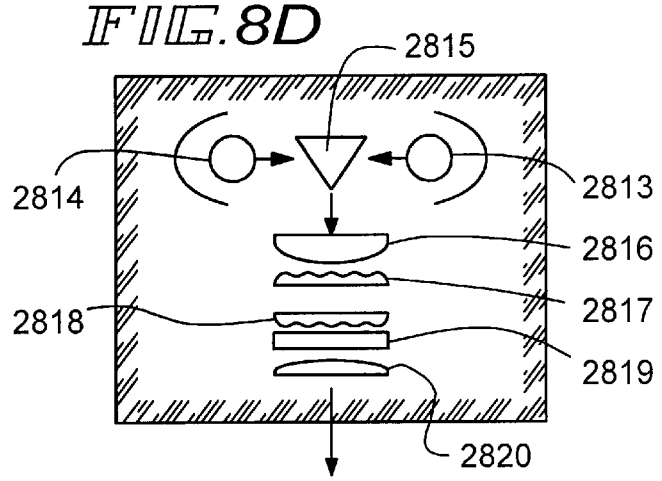

FIG. 8D is a diagram showing an example of the structure of the light source optical system 2801 in FIG. 8C. In this embodiment, the light source optical system 2801 comprises light sources 2813 and 2814, synthetic prism 2815, collimator lenses 2816 and 2820, lens arrays 2817 and 2818, and polarizing converter element 2819.

The light source optical system shown in FIG. 8D employs two light sources, but may employ three or four of light sources, or more. Of course, it may employ one light source.

Further, on discretion of a person who carries out the invention, the light source optical system may be provided with an optical system such as an optical lens, a film having a polarization function, a film for adjusting the phase difference, and an IR film.

As described above, the scope of application of the present invention is very wide, and the invention can be applied to electronic equipments of any fields. The electronic equipment of this embodiment can be realized through any combination of embodiments 1 to 5.

What is claimed is:

1. A method of fabricating a semiconductor device, said method comprising the steps of:

preparing a single crystal semiconductor substrate having a main surface of a {110} surface;

forming an oxide layer in the single semiconductor substrate;

forming a hydrogen-containing layer at a predetermined depth in the single crystal semiconductor substrate by adding hydrogen into the single semiconductor substrate from a side of the main surface through the oxide layer;

bonding the single crystal semiconductor substrate and a supporting substrate to each other;

separating the single crystal semiconductor substrate by a first heat treatment along the hydrogen-containing layer;

carrying out a second heat treatment at a temperature of 900 to 1200° C.;

polishing a single crystal semiconductor layer remaining on the supporting substrate and having a main surface of a {110} plane; and forming at least one thin film transistor using the single crystal semiconductor layer as an active layer thereof.

2. A method of fabricating a semiconductor device, said method comprising the steps of:

preparing a single crystal semiconductor substrate having a main surface of a {110} surface;

forming a porous semiconductor layer by anodic oxidation of the single crystal semiconductor substrate;

carrying out a first heat treatment on the porous semiconductor layer in a reducing atmosphere;

carrying out an epitaxial growth of a first single crystal semiconductor layer having a main surface of a {110} plane on the porous semiconductor layer;

oxidizing the first single crystal semiconductor layer to form an oxide layer, wherein a remaining portion in the first single crystal semiconductor layer which is not oxidized in the oxidizing step is defined as a second single crystal semiconductor layer;

bonding the single crystal semiconductor substrate and a supporting substrate to each other;

carrying out a second heat treatment at a temperature of 900 to 1200° C.;

polishing the single crystal semiconductor substrate until the porous semiconductor layer is exposed;

removing the porous semiconductor layer to expose the second single crystal semiconductor layer; and forming at least a thin film transistor using the second single crystal semiconductor layer over the supporting substrate as an active layer thereof (Embodiment 2).

3. A method of fabricating a semiconductor device, said method comprising the steps of:

preparing a single crystal semiconductor substrate having a main surface of a {110} plane;

forming an oxygen-containing layer at a predetermined depth in the single crystal semiconductor substrate by adding oxygen ions into the single semiconductor substrate from a side of the main surface;

converting the oxygen-containing layer into a buried oxide layer by a heat treatment, wherein a single crystal layer having a main surface of a {110} plane remains on the buried oxide layer; and forming at least one thin film transistor using the single crystal semiconductor layer as an active layer thereof.

4. A method according to claim 1, wherein the single crystal semiconductor layer is a single crystal silicon layer.

5. A method according to claim 1, wherein the semiconductor device is one selected from the group consisting of a liquid crystal display device, an EL display device, an EC display device, and a photoelectric conversion device.

6. A method according to claim 1, wherein the semiconductor device is located in a device selected from the group consisting of a video camera, a digital camera, a projector, a projection TV, a goggle type display, a car navigation system, a personal computer, and a portable information terminal.

7. A method according to claim 2, wherein each of the first and second single crystal semiconductor layers is a single crystal silicon layer.

8. A method according to claim 3, wherein the single crystal semiconductor layer is a single crystal silicon layer.

9. A method according to claim 2, wherein the semiconductor device is one selected from the group consisting of a liquid crystal display device, an EL display device, an EC display device, and a photoelectric conversion device.

10. A method according to claim 3, wherein the semiconductor device is one selected from the group consisting of a liquid crystal display device, an EL display device, an EC display device, and a photoelectric conversion device.

11. A method according to claim 2, wherein the semiconductor device is located in a device selected from the group consisting of a video camera, a digital camera, a projector, a projection TV, a goggle type display, a car navigation system, a personal computer, and a portable information terminal.

12. A method according to claim 3, wherein the semiconductor device is located in a device selected from the group consisting of a video camera, a digital camera, a projector, a projection TV, a goggle type display, a car navigation system, a personal computer, and a portable information terminal.

13. A method according to claim 1, further comprising the steps of:

patterning the single semiconductor layer to form at least a semiconductor island;

forming a gate insulating film of the thin film transistor over the semiconductor island;

forming a gate electrode of the thin film transistor over the semiconductor island with the gate insulating film interposed therebetween;

adding an impurity into the semiconductor island at a first concentration to form LDD regions in the thin film transistor;

forming the impurity into the semiconductor island at a second concentration higher than the first concentration to form a source region and a drain region in the thin film transistor.

14. A method according to claim 2, further comprising the steps of:

patterning the second single semiconductor layer to form at least a semiconductor island;

forming a gate insulating film of the thin film transistor over the semiconductor island;

forming a gate electrode of the thin film transistor over the semiconductor island with the gate insulating film interposed therebetween;

adding an impurity into the semiconductor island at a first concentration to form LDD regions in the thin film transistor;

forming the impurity into the semiconductor island at a second concentration higher than the first concentration to form a source region and a drain region in the thin film transistor.

15. A method according to claim 3, further comprising the steps of:

patterning the single semiconductor layer to form at least a semiconductor island;

forming a gate insulating film of the thin film transistor over the semiconductor island;

forming a gate electrode of the thin film transistor over the semiconductor island with the gate insulating film interposed therebetween;

adding an impurity into the semiconductor island at a first concentration to form LDD regions in the thin film transistor;

forming the impurity into the semiconductor island at a second concentration higher than the first concentration to form a source region and a drain region in the thin film transistor.

* * * * *